(12) United States Patent  
Zilkie

(10) Patent No.: US 9,627,851 B1  
(45) Date of Patent: Apr. 18, 2017

(54) DISCRETE WAVELENGTH TUNABLE LASER

(71) Applicant: ROCKLEY PHOTONICS LIMITED, Marlborough (GB)

(72) Inventor: Aaron Zilkie, Pasadena, CA (US)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 14/925,924

(22) Filed: Oct. 28, 2015

(51) Int. Cl.
    *H01S 5/0625* (2006.01)
    *H01S 5/125* (2006.01)
    *H01S 5/042* (2006.01)

(52) U.S. Cl.
    CPC .......... *H01S 5/06256* (2013.01); *H01S 5/042* (2013.01); *H01S 5/125* (2013.01)

(58) Field of Classification Search
    CPC .............................. H01S 5/06256; H01S 5/125
    See application file for complete search history.

(56) References Cited

U.S. PATENT DOCUMENTS

| | | | |
|---|---|---|---|
| 4,896,325 A | 1/1990 | Coldren | |
| 5,838,714 A | 11/1998 | Delorme | |
| 7,106,765 B2 | 9/2006 | Carter et al. | |
| 7,145,923 B2 | 12/2006 | Carter et al. | |
| 2009/0161717 A1* | 6/2009 | Reid ................... | H01S 5/06256 372/50.11 |
| 2010/0296539 A1 | 11/2010 | Fukuda et al. | |
| 2011/0292955 A1 | 12/2011 | Kaneko | |
| 2015/0010033 A1* | 1/2015 | Davies ................ | H01S 5/06256 372/50.11 |
| 2015/0010264 A1 | 1/2015 | Kaneko | |

FOREIGN PATENT DOCUMENTS

| | | |
|---|---|---|
| EP | 0665 617 A1 | 1/1995 |
| GB | 2 371 920 A | 8/2002 |

(Continued)

OTHER PUBLICATIONS

European Search Report issued in Application GB 1522542.8, dated Feb. 11, 2016, 5 pages.

(Continued)

*Primary Examiner* — Dung Nguyen
(74) *Attorney, Agent, or Firm* — Lewis Roca Rothgerber Christie LLP

(57) ABSTRACT

A multisection digital supermode-distributed Bragg reflector (MSDS-DBR) comprising: a plurality P of digital supermode Bragg reflector (DS-DBR) grating sections arranged along a waveguide; wherein each DS-DBR grating section is configured to pass or reflect light over a given spectral region, the given spectral region being different from the spectral regions of the other DS-DBR grating sections; wherein each DS-DBR grating section comprises a plurality M of grating sub-regions, each sub-region corresponding to a spectral sub-band within the spectral region of the DS-DBR grating section, and wherein each grating sub-region includes a positive electrical contact and a negative electrical contact; said grating sub-region being configured to pass or reflect light of its spectral sub-band when an electrical bias is provided between its positive and negative electrical contacts.

18 Claims, 5 Drawing Sheets

(56) References Cited

FOREIGN PATENT DOCUMENTS

| | | |
|---|---|---|
| GB | 2 373 632 A | 9/2002 |
| WO | WO 03/012936 A2 | 2/2003 |

OTHER PUBLICATIONS

Ciaffoni, L., et al. Demonstration of a widely tunable digital supermode distributed Bragg reflector laser as a versatile source for near-infrared spectroscopy, Applied Physics B, 2013, 7 pages.

Coldren et al., "Improved Sampled Grating DBR Widely-Tunable 1.55µm Lasers," Naval Research Laboratory, Contract No. NOOO14-96-1-G014, 248 pages, Mar. 6, 2000.

Keyvaninia et al., "III-V-on-silicon multi-frequency lasers," Optics Express, 21(11):13675-13683, May 30, 2013.

Overton, "Tunable Lasers: Optimized SOA ups power in DBR tunable laser," http://www.laserfocusworld.com/articles/print/volume-43/issue-12/world-news/tunable-lasers-optimized-soa-ups-power-in-dbr-tunable-laser.html, Dec. 1, 2007, 8 pages.

Ward et al.,"Modelling of phase-grating based wideband tuneable lasers with simplified quasi-digital wavelength selection," IEE Proc.-Optoelectron., 150(2):199-204, Apr. 2003.

Ward et al., "Widely Tunable DS-DBR Laser With Monolithically Integrated SOA: Design and Performance," IEE Journal of Selected Topics in Quantum Electronics, 11(1):149-156; Jan./Feb. 2005.

Whitbread et al., "Digital wavelength selected DBR laser," Proceedings of SPIE, 4995:81-93, 2003.

Reid, DCJ et al., A novel broadband DBR laser for DWDM networks with simplified quasi-digital wavelength selection, Optical Fiber Communication Conference, Mar. 21, 2002, pp. 541-543, Optical Society of America. (https://www.osapublishing.org/abstract.cfm?uri=ofc-2002-ThV5&origin=search).

Busico, G. et al., "A widely tunable Digital Supermode DBR laser with high SMSR", ECOC 2002, 28th European Conference on Optical Communication, Sep. 8-12, 2002, p. 3.3.2, vol. CONF. 28, Copenhagen, Denmark.

International Search Report and Written Opinion of the International Searching Authority, Mailed Feb. 7, 2017, Corresponding to PCT/GB2016/053350, 14 pages.

\* cited by examiner

DISCRETE WAVELENGTH TUNABLE LASER

FIELD

The present invention relates to distributed Bragg reflectors (DBRs), and particularly to multisection digital supermode-distributed Bragg reflectors (MSDS-DBRs) and discrete wavelength tunable lasers including MSDS-DBRs.

BACKGROUND

Continuously tunable lasers are well-established and are commonplace in telecommunications applications. Although telecommunications lasers operate to fixed grids (e.g., ITU grids), tunable lasers may be set up for a variety of applications and wavelength tunability is desirable to allow for correction of wavelength drift as the laser ages. Unfortunately, the requirement for full range and continuous tunability results in expensive and power-hungry electronic circuitry, most particularly due to the requirement for digital-to-analog conversion (DAC) chips.

Distributed feedback (DFB) lasers in which the gratings are built into the gain medium are being replaced by distributed Bragg reflector (DBR) lasers, particularly where tunability is required. For a wide range of tunability a sampled grating (SG) DBR laser is typically used, in which multiple waveguide gratings are cascaded with periodic blank regions, and these gratings are known as comb gratings. Thus are created reflectivity peaks which can be tuned to the required lasing wavelength.

In an alternative design of a tunable laser, digital supermode DBRs (DS-DBRs) may be utilised. The DS-DBR design has the advantage over an SG-DBR in that no DACs are required. However, related art tunable lasers made entirely on semiconductor chips may include gratings with DACs for control. Thus, there is a need for tunable lasers based upon the DS-DBR design principle but with cheaper and lower power consuming control electronics, in particular not requiring DACs.

Gratings can be tuned thermally, for example by incorporating electrodes to heaters on chip. However, for speed of operation, tuning by current injection can be used, for example by biasing a p-i-n or p-n diode junction.

The gratings of tunable lasers in related art III-V semiconductor material systems may have vertical p-i-n diode junctions with a common ground or negative electrode. In these lasers multiple grating sub-regions, such as those in a DS-DBR, require separate drive contacts but must share a common ground.

SUMMARY

Accordingly, the present invention aims to solve the above problems by providing, according to a first aspect, a multisection digital supermode-distributed Bragg reflector (MSDS-DBR) comprising: a plurality P of digital supermode Bragg reflector (DS-DBR) grating sections arranged along a waveguide; wherein each DS-DBR grating section is configured to pass or reflect light over a given spectral region, the given spectral region being different from the spectral regions of the other DS-DBR grating sections; wherein each DS-DBR grating section comprises a plurality M of grating sub-regions, each sub-region corresponding to a spectral sub-band within the spectral region of the DS-DBR, and wherein each grating sub-region includes a positive electrical contact and a negative electrical contact; said grating sub-region being configured to pass or reflect light of its spectral sub-band when an electrical bias is provided between its positive and negative electrical contacts. As used herein, a "plurality P" of elements means P elements, P being a positive integer.

In some embodiments of the present invention, each DS-DBR grating section will include an opto-electronic region such as a diode region. For example, where each DS-DBR sub-region includes a p-i-n diode junction, the electrical connections of the DS-DBR sub-regions provide a mechanism for applying electrical bias across the p-i-n junction to control the opto-electronic properties and therefore the transmittance or reflectance of each of the M spectral sub-bands.

The p-i-n diode junctions may be horizontal p-i-n junctions. The junctions are considered to be horizontal in that they are formed by a first doped region at (and/or extending into) one side wall of the waveguide and a second doped region at (and/or extending into) the opposite side wall of the waveguide. All or at least the majority of the doped regions of the semiconductor junction therefore lie along a horizontal plane.

The horizontal junction enables increased flexibility in both design and fabrication as the location of doped sections at either side of the waveguide rather than above or below the waveguide gives rise to a greater degree of freedom in terms of driving and connecting up multiple junction regions, complexity of driving scheme, ease of connections, size, and shape. With particular relevance to the present invention, horizontal p-i-n diode junctions may be provided in which both positive and negative electrodes can be discretized into multiple contacts to simplify driving circuits and even reduce number of gratings and allow for shorter laser cavities. This would not be possible for typical vertical p-i-n lasers which share a common ground as only the positive contacts of the vertical design lasers can be discretized into multiple sections.

Optionally, the multisection digital supermode-distributed Bragg reflector comprises a common electrode structure shared between two or more of the plurality of DS-DBR grating sections of the MSDS-DBRs; wherein the common electrode structure includes at least one common electrode(s), each of the at least one common electrode(s) connecting to an electrical contact on two or more of the DS-DBR grating sections to simultaneously provide an electrical bias to a respective one of the grating sub-regions on each of the two or more DS-DBR grating sections.

In this way, when a bias is applied via the common electrode, a bias will be applied simultaneously to a grating sub-region on each of the two or more DS-DBR grating sections. The common electrodes which contact the positive electrical contacts may be arranged such that they only connect to an electrical contact for one sub-region within each DS-DBR grating section. However, in such a system, a single common electrode may connect all of the negative electrical contacts as a common return.

In some embodiments, the common electrode structure includes a plurality M of common electrodes, each of the M common electrodes connecting to an electrical contact on each of the DS-DBR grating sections to simultaneously provide an electrical bias to a respective one of the M grating sub-regions of each of the DS-DBR grating sections.

In this way, when a bias is applied to a given one of the M common electrodes, the electrode will select a corresponding sub region within each of the plurality P of DS-DBR grating sections.

The common electrodes may be arranged to apply a bias to a particular grating sub-region in each DBR. For example, a first common electrode may be configured to apply a bias to the first grating sub-region in each of the P DS-DBR grating sections (i.e. the closest to the entrance to the waveguide). A second common electrode may be arranged to apply a bias to the second grating sub-region in each of the plurality P of DS-DBR grating sections (i.e. the second closest to the entrance of the waveguide). A third common electrode may be arranged to apply a bias to the third grating sub-region in each of the plurality P of DS-DBRs. This pattern may continue up until the $M^{th}$ common electrode which may be configured to apply a bias to the $M^{th}$ (i.e. the final) grating sub-region of each one of the plurality P of DS-DBRs.

Each grating sub-region will have a pair of electrical contacts consisting of two physical electrical contacts, such as contact pads, a positive contact for connecting to a positive electrode (shared or otherwise) and a negative contact for connecting to a negative electrode (shared or otherwise).

The grating sections may be arranged to alternate in polarity. In this way, each grating sub-region faces in the opposite direction to its two closest neighbours.

Optionally, all of the M common electrodes are positive electrodes.

In some embodiments, regardless of the number of positive common electrodes, a single common negative electrode may connect to an electrical contact for each grating sub-region of all of the DS-DBRs. In this way, selection of the desired grating sub-region is achieved by way of a bias applied to the respective positive electrode.

In other embodiments, the multisection digital supermode-distributed Bragg reflector may comprise a plurality P of common negative electrodes, wherein each of the P common negative electrodes is configured to apply a negative bias to all of the grating sub-regions within a given one of the plurality P of DS-DBRs. In this way, coarse selection of the MSDS-DBR can be achieved by applying a negative bias to the common negative electrodes corresponding to the DS-DBR for which selection is desired; and fine selection of the MSDS-DBR can be achieved by applying a positive bias to the common positive electrode which provides an electrical contact to the desired grating sub-region.

Optionally, each of the DS-DBRs is a transmissive DS-DBR.

Alternatively, each of the DS-DBRs may be a reflective DS-DBR.

M and P are at least 2 and have maximum values limited by practical manufacturing and electrical contacting and driving constraints. Optionally, the number P of DS-DBRs in the MSDS-DBR is more than or equal to 4. The number M of grating sub-regions within each DS-DBR may also be more than or equal to 4. If P=4 and M=4, the MSDS-DBR will provide a mechanism for selecting one of 16 different spectral sub-bands (corresponding to 16 grating sub-regions). In an alternative embodiment P and/or M may be more than or equal to 7.

According to a second aspect of embodiments of the present invention, there is provided a discrete wavelength tunable laser comprising: a semiconductor optical amplifier (SOA) and a multisection digital supermode-distributed Bragg reflector (MSDS-DBR) according to the first aspect.

Where the MSDS-DBR includes a plurality of positive common electrodes and only a single negative electrode, the wavelength tunable laser will also comprise a coarse spectral filter having a plurality P of spectral passbands. In this way, the coarse spectral filter enables a selection of one of P different spectral passbands, each of which falls within the overall bandwidth of the SOA of the laser. The multisection digital supermode-distributed Bragg reflector (MSDS-DBR) then provides fine tuning to select a spectral sub-region within each of the P passbands. The spectral overlap of the spectral region chosen by the coarse selection and the spectral region chosen by the fine selection provides the lasing mode of the laser. The wavelength tunable laser provided by the present invention advantageously does not therefore depend upon DACs for primary control.

Optionally, the coarse spectral filter may be a transmission DS-DBR (TDS-DBR), the TDS-DBR having a plurality P of transmission passbands, each of the P passbands corresponding to the given spectral region of a respective one of the DS-DBRs of the multisection digital supermode-distributed Bragg reflector (MSDS-DBR).

According to a third aspect of embodiments of the present invention, there is provided a discrete wavelength tunable laser comprising: an SOA; a coarse spectral filter for coarse tuning, the coarse spectral filter configured to pass P separate spectral passbands within the gain bandwidth of the SOA; and a multisection digital supermode-distributed Bragg reflector (MSDS-DBR) according to any one of the first aspect or second aspect of embodiments for fine tuning; wherein each of the P passbands of the coarse spectral filter corresponds to the given spectral region of one of the DS-DBRs of the multisection digital supermode-distributed Bragg reflector (MSDS-DBR).

Optionally, the coarse spectral filter is a transmission DS-DBR (TDS-DBR), the TDS-DBR having a plurality P of transmission passbands, each of the P passbands corresponding to the given spectral region of one of the DS-DBRs of the multisection digital supermode-distributed Bragg reflector (MSDS-DBR).

In this way, the TDS-DBR is configured to pass any one of P spectral passbands upon application of a bias current, all of which lie within the gain bandwidth of the SOA. Each DS-DBR grating section is configured to pass or reflect M sub-regions of the spectrum within a passband of the P passbands of the TDS-DBR.

The electrical contacts for one spectral sub region M in each of the P DS-DBR gratings in the MSDS-DBR grating may be connected with a common control electrode;

Optionally, the SOA is a reflective semiconductor optical amplifier (RSOA). In this way, the back facet of the gain medium is a fully reflective surface. The output of the laser cavity is located at the opposite end of the cavity to the RSOA. When the MSDS-DBR is transmissive, a broadband mirror forms the output mirror of the laser cavity. When the MSDS-DBR is reflective, the MSDS-DBR itself forms the output mirror of the laser cavity.

According to a third aspect of embodiments of the present invention, there is provided a discrete wavelength tunable laser comprising: an SOA; a single reflective DS-DBR grating with N grating sub-regions, each sub-region corresponding to a spectral sub-band within the spectral region of the DS-DBR, wherein: each grating sub-region has a positive electrical contact and a negative electrical contact; and wherein: a single control circuit provides for an electrical bias to be applied across the positive and negative electrical contacts of each of the N grating sub-regions in order to control whether each of said grating sub-regions transmits or reflects light of their respective spectral sub-band.

By applying discrete predetermined currents to one or more of the contacts at the same time, it will result in reflectivity enhancement of a certain fixed sub-band. In one embodiment, the single DS-DBR has N=16 sections (i.e. 16 grating sub-regions). In one embodiment, the single DS-DBR has N=49 sections (i.e. 49 grating sub-regions).

For any of the reflective MSDS-DBRs disclosed herein, the reflectivity could be tailored to account for the non-uniformity of the spectral output of the SOA. For example, for parts of the gain bandwidth of the SOA where output power is low, the grating sub-regions corresponding to those wavelengths may exhibit an enhanced reflectivity relative to other grating sub-regions within the MSDS-DBR.

Similarly, for any transmissive MSDS-DBRs, the relative transmission values of grating sub-regions may be altered to compensate for wavelength dependent gain variation from the SOA.

Each of the one or more DS-DBRs may be a phase-tunable Distributed Bragg Reflector which preferably includes a phase tuning region, the carrier density of which can be manipulated by application of a current or voltage bias. The bias may be a forward bias or a reverse bias depending on the properties of the phase tuning region chosen. Adjusting the bias will in turn adjust the phase and position in frequency space of the reflectance spectrum or transmittance spectrum of that region of the DS-DBR. The phase tuning region may be a portion of or all of the DS-DBR.

Optionally, the phase tuning region includes a p-n junction device. In this way, the p-n junction device provides an electrically tunable phase tuning region whereby the phase of the reflectance spectrum of the DBR can be adjusted via carrier depletion by application of a varying reverse bias. The p-n junction may optionally be a p+-p-n-n+, or p++-p+-p-n+-n++ structure.

The MSDS-DBR may be reflective. If this is the case, no output mirror is needed

Alternatively, the MSDS-DBR may be transmissive. If this is the case, an output mirror may be provided by way of an optical broadband mirror. Such a mirror could have reflectivity of 5-50% and typically more than 10%, or even more than 20%.

Optionally, for any one of the aspects above, the discrete wavelength tunable laser may further comprise one or more phase tuner(s) for fine tuning the wavelength of the laser.

This phase tuner would be separate from any phase tuners that may form part of the DS-DBR. The fine tuning phase tuner may be used to account for drift due to temperature or other environmental factors.

In a Si photonics waveguide the gratings are produced by, for example, etching teeth with a certain depth (usually 200-500 nm) in the top of the waveguide, along the whole width of the waveguide. For any one of the embodiments of the present invention, the silicon overlayer thickness of the waveguide platform comprising the laser and/or MSDS-DBR may be more than or equal to 1 µm and less than or equal to 4 µm. Even more preferably, the silicon overlayer thickness of the waveguide platform is more than or equal to 2.5 µm and less than or equal to 3.2 µm. Preferably, the ridge width of one or more waveguides of the waveguide platform is more than or equal to 1 µm and preferably less than or equal to 4 µm. Even more preferably, the ridge width of one or more waveguides of the waveguide platform is more than or equal to 2.5 µm and less than or equal to 3.2 µm.

Throughout the application, references to "light" should be understood to include electromagnetic radiation of infra-red and ultraviolet wavelengths as well as the visible spectrum. The range in output wavelengths of the laser will depend on the semiconductor gain medium used which may fall within the range of 0.4-20 µm. Taking into account the silicon-on-insulator SOI platform, a wavelength range of a tunable SOI laser may be 1.1-1.7 µm.

Further optional features of embodiments of the invention are set out below.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a discrete wavelength tunable laser provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
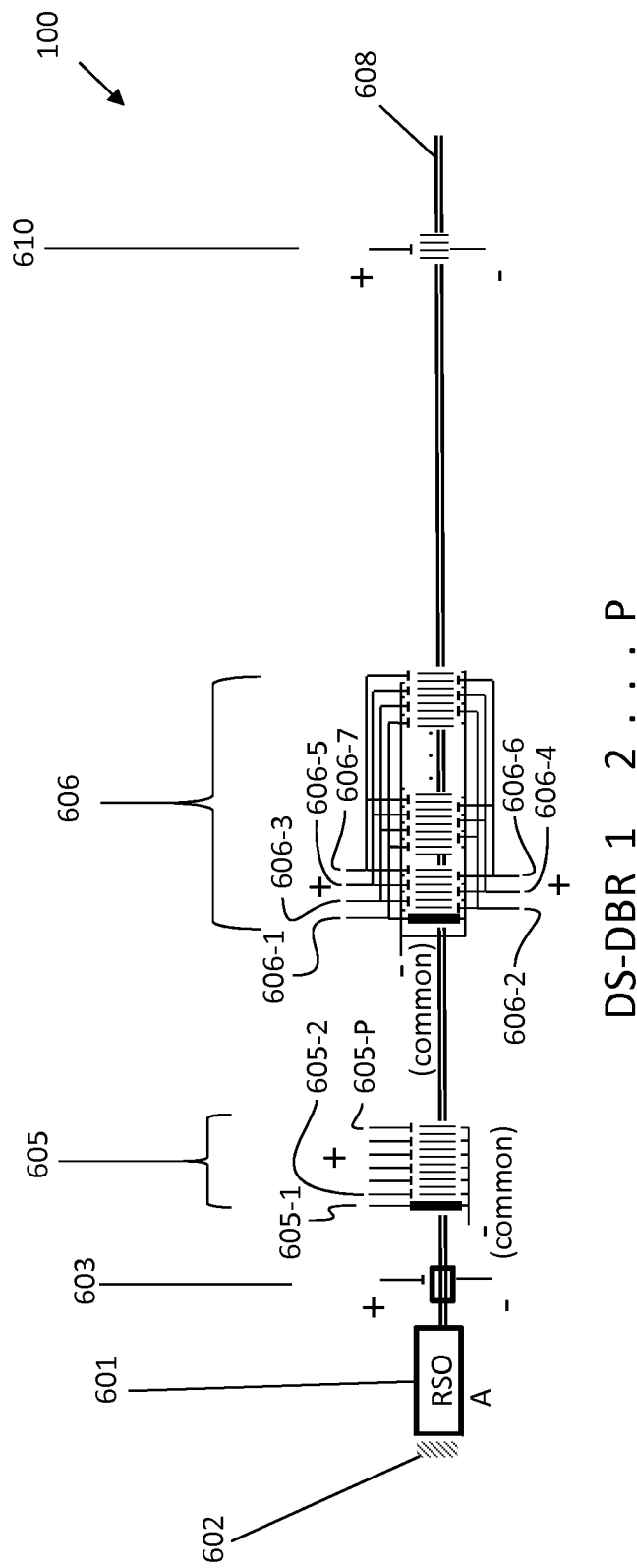
FIG. 1A shows a schematic diagram of a discrete wavelength tunable laser including a transmissive MSDS-DBR.

FIG. 1A depicts a discrete wavelength tunable laser 100 according to the present invention.

In this aspect the optical cavity is made up of an RSOA 601, a transmission digital supermode-distributed Bragg reflector (TDS-DBR) 605, having P sections and being configured to pass one of P corresponding spectral regions, or "coarse spectral regions" of width W within the gain bandwidth of the RSOA upon application of a bias current; and a multisection digital supermode-distributed Bragg reflector (MSDS-DBR) 606, the MSDS-DBR comprising: a plurality, P, of DS-DBR grating sections, or "DS-DBRs", each DS-DBR configured to pass (transmit) or reflect light over a given spectral region, the given spectral region being different from the spectral regions of the other DS-DBRs.

Each DS-DBR comprises a plurality M of grating sub-regions, and a plurality M of respective pairs of electrical contacts to each of the grating sub-regions. Each pair of electrical contacts comprising a 'positive electrical contact' for connection to a positive electrode structure and a 'negative electrical contact' for connection to a negative electrode structure such that the DS-DBR is configured to pass or reflect any one of M different spectral sub-bands within its given spectral region upon electrical bias across the respective one of the M pairs of electrical contacts.

The MSDS-DBR grating may be a chirped Bragg reflector. When the MSDS-DBR is unbiased, each sub-region of each grating section of the MSDS-DBR may reflect wavelengths within a spectral sub-band, so that the MSDS-DBR is reflective over a total spectral range that is the union of the spectral sub-bands. When a bias is applied to a first sub-region of the MSDS-DBR (configured to reflect, when unbiased, a first spectral sub-band), the index of refraction of the sub-region may shift, and the range of wavelengths over which the sub-region is reflective may shift accordingly, to overlap a second (e.g., adjacent) spectral sub-band. This may result in a decrease in reflectivity (i.e., an increase in transmissivity), in the first spectral sub-band, and an increase in reflectivity in the second spectral sub-band. For example, the MSDS-DBR may have a total spectral range of 1527.6-1572.4 nm, composed of 7 spectral regions each 6.4 nm wide, each of which is in turn composed of 8 spectral sub-bands, each 0.8 nm wide.

The TDS-DBR may have a similar total spectral range, and may operate in a similar manner. It may be composed of P sections that may not be further divided into sub-regions, as a result of which the reflectivity and transmissivity of the TDS-DBR may be controlled over relatively coarse spectral regions that may be wider than the spectral sub-bands of the MSDS-DBR. For example, the TDS-DBR may have 7 spectral regions, each 6.4 nm wide, and each overlapping a corresponding spectral region of the MSDS-DBR.

The MSDS-DBR 606 includes a common electrode structure made up of a plurality M of common positive electrodes 606-1, 606-2, . . . 606-7 and a single common negative electrode.

Each of the M common positive electrodes connects to an electrical contact on each of the DS-DBRs to simultaneously provide an electrical bias to a respective one of the M grating sub-regions of each of the DS-DBRs. For example, it can be seen from FIG. 1A that a first common electrode 606-1 connects to the first grating sub-region in the $1^{st}$ DS-DBR, the $1^{st}$ grating sub-region in the second DS-DBR, and the pattern continues up until the $P^{th}$ DS-DBR.

In this way, when a bias is applied to a given one of the M common electrodes, say the $1^{st}$ common positive electrode 606-1, the common electrode will simultaneously apply a bias to the first grating sub-region in each DS-DBR of the MSDS-DBR, thereby selecting a corresponding spectral sub-band within each of the plurality P of DS-DBRs.

Figure 2:
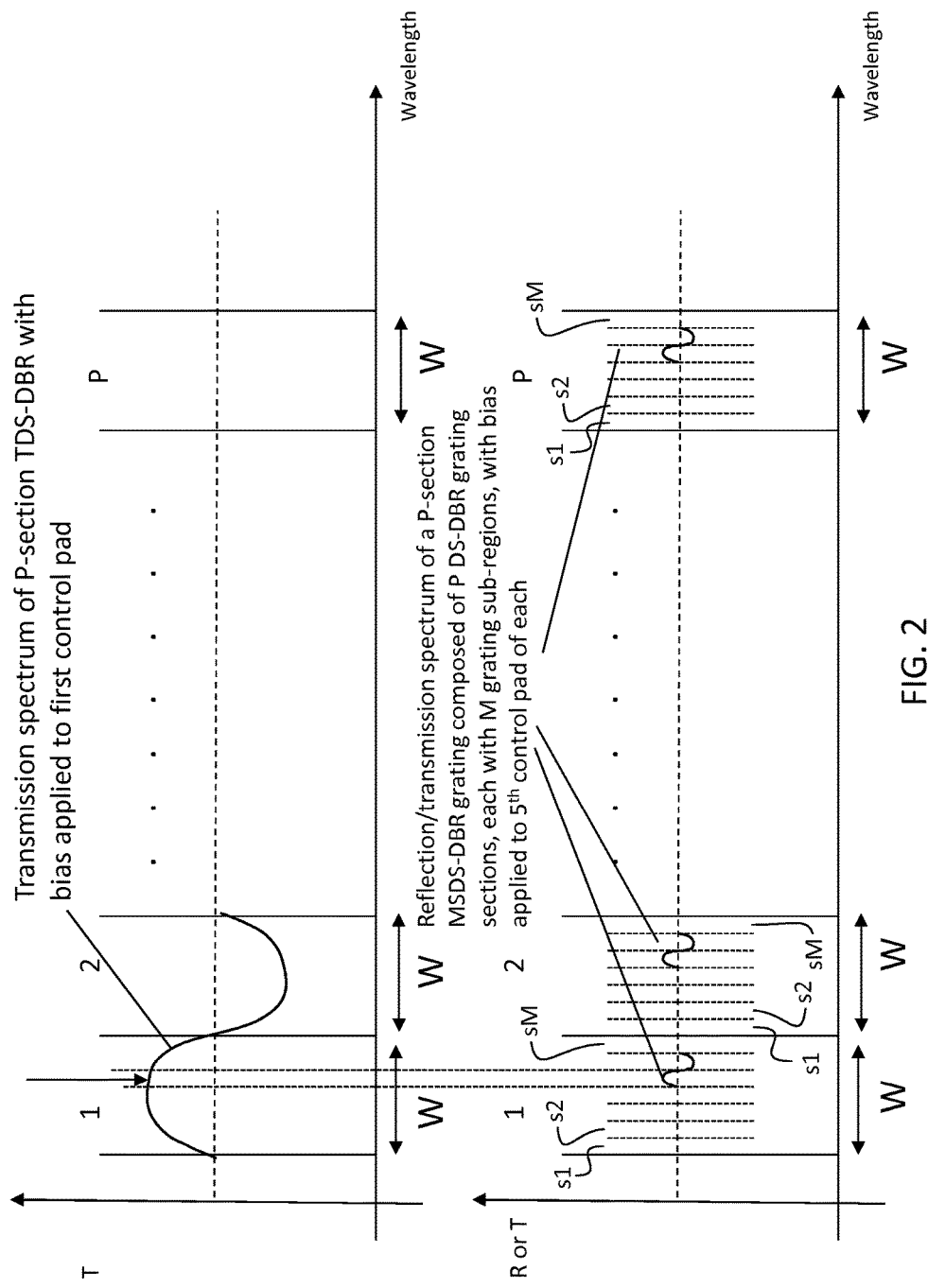
FIG. 2 shows a schematic diagram explaining mode selection of the discrete wavelength tunable lasers of FIG. 1A or FIG. 1B.

This may result in a comb of P selected spectral sub-bands in the DS-DBRs as shown in the lower portion of FIG. 2, each selected spectral sub-band being one of M spectral sub-bands s1, s2, . . . sM of a corresponding DS-DBR.

The spectral profiles of the TDS-DBR 605 and MSDS-DBR 606 are chosen such that the period of the comb produced by the MSDS-DBR is equal to the spectral width of each of the P regions of the TDS-DBR. The lasing mode of the discrete wavelength tunable laser is chosen by the overlap of the selected spectral passband of the transmission DS-DBR with one of the spectral bands in the selected comb in the MSDS-DBR.

In this way, as shown in FIG. 2, by applying a selecting bias on one of the control electrodes 605-1, 605-2 . . . 605-P of the first TDS-DBR and a selecting bias on one of the common control electrodes of the MSDS-DBR one of M×P modes in the gain spectrum of the RSOA is digitally selected. It may therefore be sufficient to control two out of M+P control electrodes, as opposed to one out of M×P electrodes, thereby simplifying the number of digital controls and reducing the number of connections to a digital driving circuit, simplifying the digital driving circuit compared to that required for a digital scheme using only conventional SG-DBRs and/or DS-DBRs.

Furthermore, by using a TDS-DBR for coarse selection rather than a passive optical component such as an arrayed waveguide grating (AWG), the overall size of the laser cavity can be significantly reduced. The lengths of the TDS-DBR and MSDS-DBR gratings combined can be less than that of an AWG.

In the embodiment of FIG. 2, a transmission spectrum is shown corresponding to a specific one of the P sections of the TDS-DBR when a bias is applied to a first control pad, where a control pad is defined as the metal region that contacts the p- or n-doped region in the silicon to create an electrical contact between the electrode and the doped silicon. The reflectance (or transmittance) spectrum of the MSDS-DBR is shown underneath the transmission spectrum of the TDS-DBR. As can be seen, an electrical bias applied to the 5th common control pad results in a transmission or reflection spectrum repeated P times. The alignment of the transmission spectrum of the TDS and that of the MSDS-DBR results in lasing of the 5th mode (out of M×P modes).

In the embodiment shown in FIG. 1A, the DS-DBRs which make up the MSDS-DBR are all transmissive DS-DBRs meaning that when a bias is applied to a grating sub-region to "select" the grating sub-region, it results in transmission of a particular spectral sub-band through the DS-DBR. The laser therefore may have a broadband output mirror 610, such as a broadband mirror grating to complete the laser cavity. For a transmissive MSDS-DBR the cavity length set by broadband mirror grating 610 is set such that there are N or more possible cavity modes within the total spectral region of the laser, such that at least one of the N or more cavity modes overlaps with each of the spectral sub-bands M of each of the P coarse spectral regions. The broadband mirror has a higher reflectivity than the transmissive MSDS-DBR in all regions of the spectrum.

Precise alignment of the cavity modes to the optimum position in the spectral sub-bands can be achieved by an additional separate phase tuning section (603), or by additional fine tuning of the bias on the electrodes of the DS-DBR.

The wavelengths of standing wave modes due to the high reflectivity broadband mirror (HR-BBM) may be taken into account in designing the MSDS-DBR structure. BBM reflectivity may be adjusted to produce the desired laser slope efficiency and output power and stability, and can be low, e.g., on the order of 5-10%, to have smaller FP (Fabry-Perot) peaks and get higher optical output power, or can be as high as 50-70% to have increased stability but lower output slope efficiency and power. The SOA may be designed to have sufficiently low gain at wavelengths outside of the total spectral range of the TDS-DBR and of the MSDS-DBR that the round-trip gain is less than one for such wavelengths. The total spectral range of the TDS-DBR may also be selected to be greater than the total spectral range of the MSDS-DBR, so that it includes, on one or both ends, grating regions (that may be passive, i.e., not configured to be electrically controlled) that do not correspond to spectral regions of the MSDS-DBR, and that may prevent lasing at wavelengths not within the total spectral range of the MSDS-DBR.

The laser may then lase in a mode within the transmission window of the combined TDS-DBR selected passband and the MSDS-DBR selected sub-band. Lasing at wavelengths outside of this transmission window may be avoided by selecting the characteristics and positions of the TDS-DBR grating, the MSDS-DBR grating, and the BBM so that at such wavelengths the magnitude of the electric field reflected back from the compound mirror formed by the TDS-DBR grating, the MSDS-DBR grating, and the BBM is less than the magnitude of the field reflected back within the transmission window. For example, for such wavelengths reflections from the TDS-DBR grating, the MSDS-DBR grating, and the BBM may not be in phase and may partially cancel.

Grating lengths (the grating length is the length from the front of first notch to the end of the last notch) of all gratings (MSDS-DBR, TDS-DBR, and broad band reflector) play an important role. Total grating lengths may be as short as possible, e.g., <500 µm total, but lengths may be in range of <100 µm up to 2 mm.

Gratings may be etched into the top, sidewalls, and/or slab of the SOI waveguide.

The gratings of the MSDS-DBR 606 are fabricated in a single waveguide and the electrodes are interdigitated along the waveguide as appropriate to give the required number of DS-DBR gratings in as short a length of waveguide as possible.

In FIG. 1A only three DS-DBR gratings are shown but one skilled in the art will appreciate that a plurality of DS-DBR gratings may be fabricated in the waveguide to produce a wavelength selectable front reflector for the laser cavity. For example, 49 reflective sub-bands would be possible with 7 DBR gratings having 7 states each. The DS-DBR 605 gives transmission wavelength selection as shown in FIG. 2.

As shown in FIG. 1A, the M sub-regions have alternating polarities, such that each sub-region has the opposite polarity to the two regions on either side of it. It is, however envisaged that in an alternative embodiment (not shown) all of the sub-regions may have the same polarity. If all of the sub-regions have the same polarity, all of the positive electrodes would be on one side of the grating and all commonly-connected negative electrodes would be together on the opposite side of the grating.

Each DS-DBR consists of chirped grating sub-regions with grating pitch increasing with grating length.

Each DS-DBR grating section may be formed of contiguous sub-regions. Each sub-region may include a p and n doped region and an associated positive and negative electrode electrically connected (via electrical contacts such as contact pads) to the p and n doped regions to form a diode. Electrical isolation between each diode and neighboring diodes is achieved by physical separation of adjacent electrodes along the grating propagation direction. The separation (i.e. the gap between adjacent electrodes) may be great enough that a bias applied across one diode via its electrodes to change its reflectance or transmittance will not give rise to a bias being generated at the neighboring diode. As well as physical separation of adjacent electrodes, the p and n doped regions of adjacent diodes may also be physically separate from one another to provide further electrical isolation between any given diode and its neighbors along the grating propagation direction.

Each DS-DBR will have slightly different grating periods, corresponding to the different spectral sub-bands to which each grating sub-region corresponds. DS-DBRs covering a longer-wavelength spectral region may be constructed with longer-period gratings.

The spacing between adjacent DS-DBRs may be small or almost zero, to minimize gaps in between any two DS-DBRs. The gaps may be made to be just sufficiently large for electrical isolation.

When current is injected into one electrode, it will not spread into the adjacent regions. Electrodes are separated by contact isolation. In some embodiments there is no p+ doping/metallization in the isolation gaps.

Figure 1B:
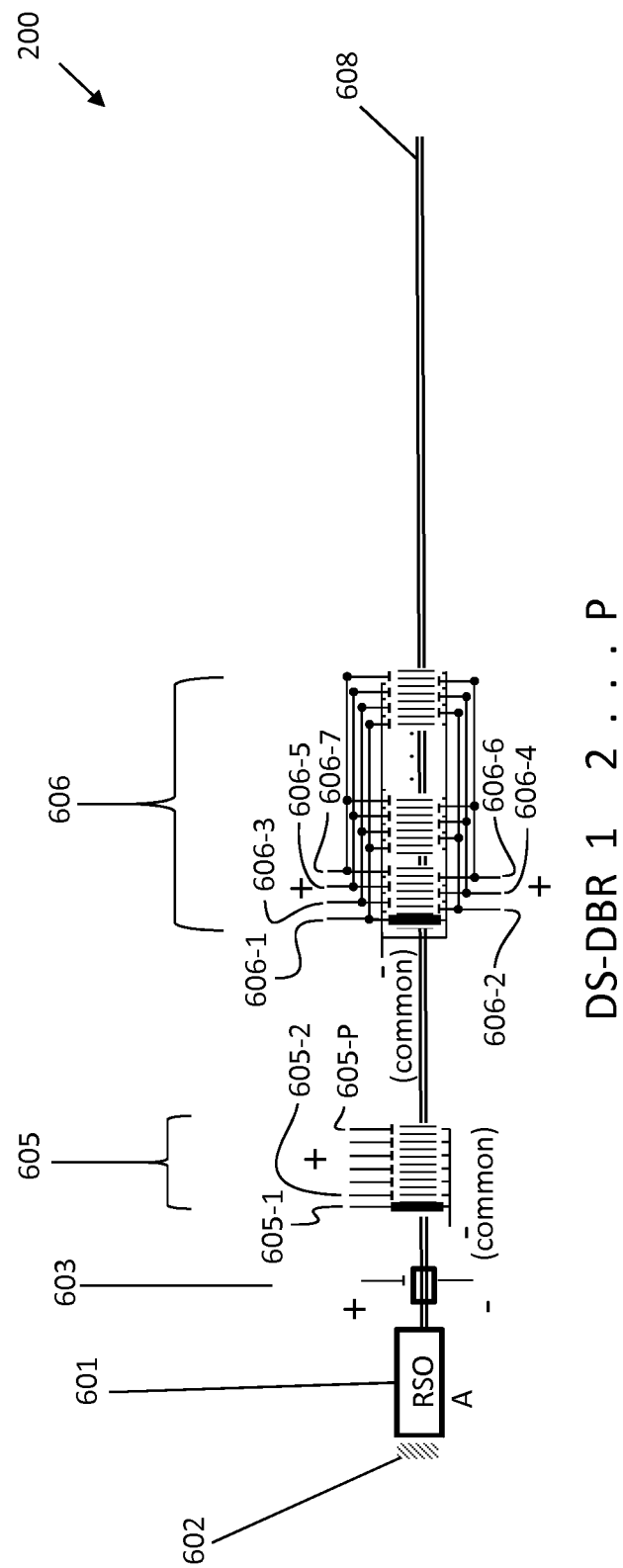
FIG. 1B shows a schematic diagram of an alternative discrete wavelength tunable laser including a reflective MSDS-DBR.

An alternative discrete wavelength tunable laser 200 is shown in FIG. 1B. The laser of FIG. 1B differs from that of FIG. 1A in that it includes a reflective MSDS-DBR instead of a transmissive MSDS-DBR. A further broadband mirror may be absent from the laser, since the reflective MSDS-DBR itself forms the output mirror of the laser cavity. The cavity length may be shorter in the reflective MSDS-DBR structure. Again, the TDS-DBR 605 gives transmission wavelength selection as shown in FIG. 2. The TDS-DBR may be designed so that its maximum reflectivity when biased is less than the maximum reflectivity of the MSDS-DBR, so that the round-trip gain for light reflecting from the TDS-DBR is less than one.

The embodiments shown in FIG. 1A and FIG. 1B may have a relatively small physical size as they may include only DS-DBR gratings, and no DAC may be used for switching. In some embodiments a slow DAC is included for control of a phase section 603, to trim the overall wavelength in response to drift with age or environment.

Figure 3:
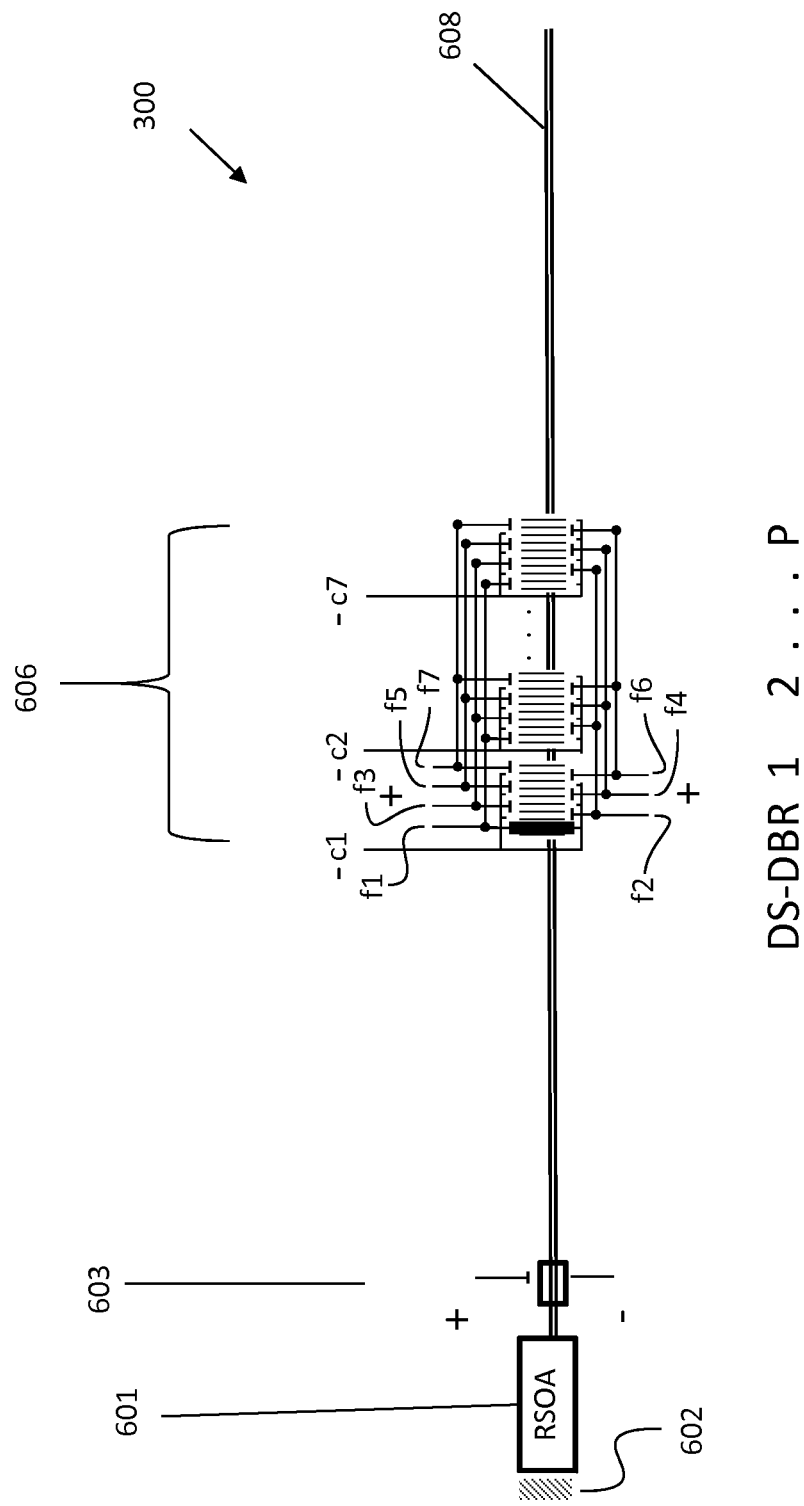
FIG. 3 shows a schematic diagram of an alternative discrete wavelength tunable laser.

Another embodiment of a discrete wavelength tunable laser 300 is shown in FIG. 3. The laser of FIG. 3 differs from that in FIG. 1B in that the TDS-DBR is removed and the coarse selection function that had been performed by the TDS-DBR in FIGS. 1A and 1B is integrated into the MSDS-DBR by making the negative electrodes separate and selectable. There is a common negative electrode for each of the plurality P of DS-DBRs.

In this case a channel is selected for lasing by applying a positive voltage to a selected one of the common control electrodes f1, f2, . . . fM (where, in FIG. 3, M=7), the selected control electrode being associated with the sub-band corresponding to the channel to be selected, as in earlier embodiments; then a large enough negative voltage is applied to only one of the negative electrodes so as to turn on the diodes only in the DS-DBR that corresponds to the coarse region of the spectrum containing the channel being selected.

The negative voltage applied to the other P-1 negative electrodes may be such that the voltage drop across the diodes of the same sub-band on the other DS-DBR gratings resulting from the application of the positive voltage to the common control electrode are below their turn-on voltage.

Some embodiments differ from that of FIG. 3 in that the MSDS-DBR takes the form of a reflective MSDS-DBR with coarse negative electrodes.

Figure 4:
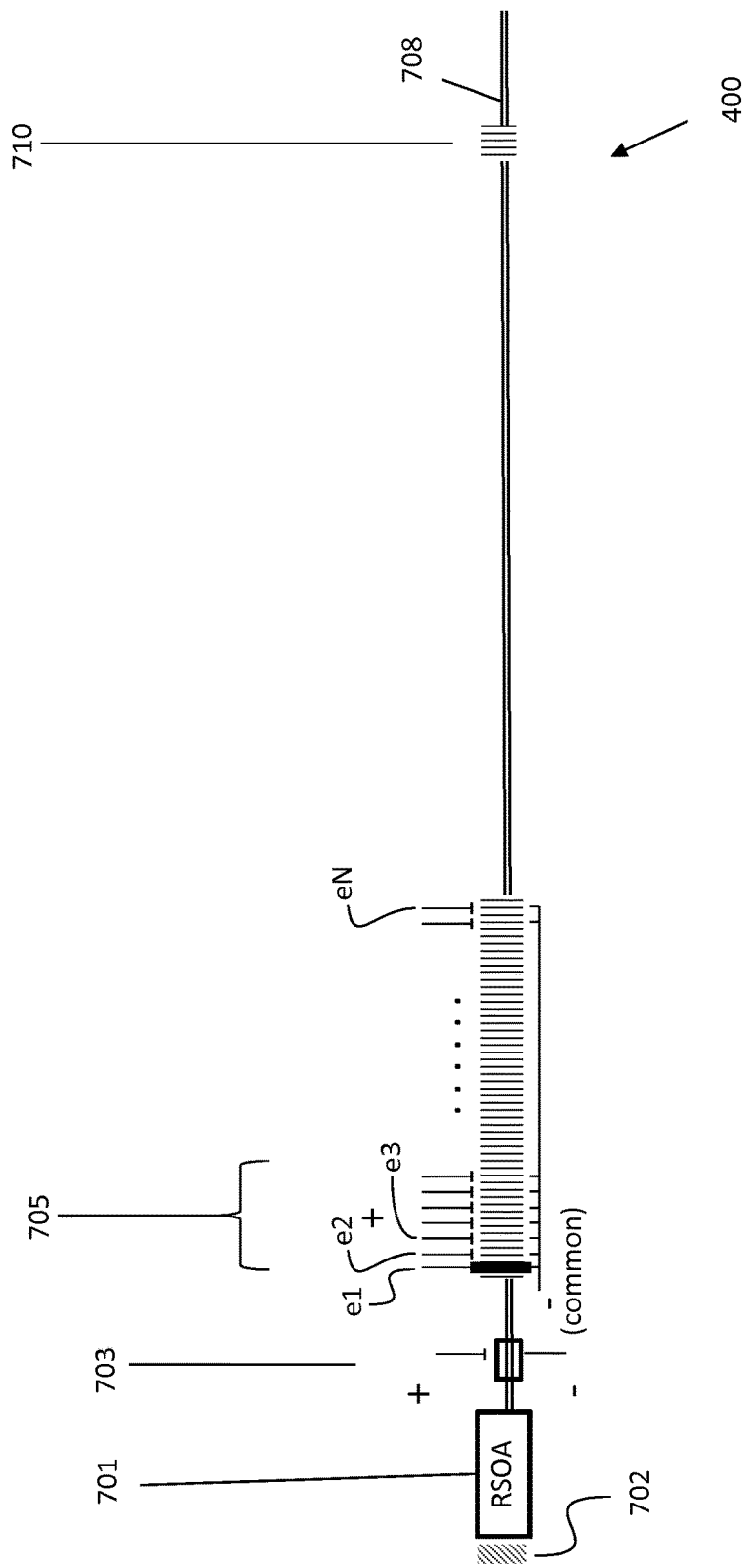
FIG. 4 shows a schematic diagram of a further alternative discrete wavelength tunable laser.

Referring to FIG. 4, in one embodiment a single reflective N-section DS-DBR grating with N corresponding positive electrodes e1, e2 . . . eN is used to create the same number of discrete wavelength states for the tunable laser. In one embodiment, N=49; in other embodiments N may be larger or smaller than 49.

In this embodiment, one control circuit controlling one out of M×P control electrodes may be used. The grating design is simple, and the control circuit is simpler, and the laser cavity length can be made short. However the number of control electrodes may be larger, e.g., M×P as compared to M+P for the embodiments of FIGS. 1A, 1B and 3. A greater number of electrodes may be more difficult for a control circuit to connect to and manage, especially as the number N of laser modes needed scales to numbers much higher than the embodiment shown which includes 49 grating sub-regions.

Although exemplary embodiments of a discrete wavelength tunable laser have been specifically described and illustrated herein, many modifications and variations will be apparent to those skilled in the art. Accordingly, it is to be understood that a discrete wavelength tunable laser constructed according to principles of this invention may be embodied other than as specifically described herein. The invention is also defined in the following claims, and equivalents thereof.

What is claimed is:

1. A reflector comprising:
one or more digital supermode Bragg reflector (DS-DBR) grating sections arranged along a waveguide; wherein each DS-DBR grating section is configured to pass or reflect light over a given spectral region, the given spectral region being different from the spectral regions of the other DS-DBR grating sections;
wherein each DS-DBR grating section comprises a plurality of grating sub-regions, each grating sub-region corresponding to a spectral sub-band within the spectral region of the DS-DBR grating section, and
wherein each grating sub-region includes a positive electrical contact and a negative electrical contact; said grating sub-region being configured to pass or reflect light of its spectral sub-band when an electrical bias is provided between its positive and negative electrical contacts.

2. The reflector of claim 1,
wherein the one or more DS-DBR grating sections include at least two DS-DBR grating sections, wherein the reflector comprises a common electrode structure shared between two or more of the DS-DBR grating sections;
wherein
the common electrode structure includes a common electrode, the common electrode being connected to an electrical contact on two or more of the DS-DBR grating sections to simultaneously provide an electrical bias to a respective one of the grating sub-regions on each of the two or more DS-DBR grating sections.

3. The reflector of claim 2, wherein:
the common electrode structure includes a plurality of common electrodes, each of the common electrodes being connected to a respective electrical contact on each of the DS-DBR grating sections to simultaneously provide an electrical bias to a respective one of the grating sub-regions of each of the DS-DBR grating sections.

4. The reflector of claim 2, wherein the common electrode is a positive electrode.

5. The reflector of claim 4, wherein a single common negative electrode is arranged to connect with each grating sub-region of all of the DS-DBR grating sections.

6. The reflector of claim 4, comprising a plurality of common negative electrodes, wherein each of the common negative electrodes is configured to apply a negative bias to all of the grating sub-regions within a respective one of the one or more DS-DBR grating sections; such that:
coarse selection of the reflector can be achieved by applying a negative bias to the common negative electrode corresponding to the DS-DBR grating section for which selection is desired; and
fine selection of the reflector can be achieved by applying a positive bias to the common positive electrode which provides an electrical contact to the grating sub-region for which selection is desired.

7. A discrete wavelength tunable laser comprising:
a semiconductor optical amplifier (SOA);
a reflector according to claim 1.

8. The reflector of claim 1, wherein each of the DS-DBR grating sections is a transmissive DS-DBR.

9. The reflector of claim 1, wherein each of the DS-DBR grating sections is a reflective DS-DBR.

10. The reflector of claim 1 wherein each DS-DBR grating section comprises 4 grating sub-regions.

11. The reflector of claim 1, comprising 4 DS-DBR grating sections.

12. The reflector of claim 1, wherein each grating sub-region includes a p-i-n diode junction, the positive and negative electrical contacts located at p and n doped regions of the p-i-n junction respectively for providing an electrical bias across the p-i-n junction for control of the transmittance or reflectance of each of the spectral sub-bands.

13. The reflector of claim 12 wherein the p-i-n diode junctions are horizontal p-i-n junctions.

14. A discrete wavelength tunable laser comprising:
a semiconductor optical amplifier (SOA);
a reflector according to claim 1; and
a coarse spectral filter having a plurality P of spectral passbands;
wherein each of the P spectral passbands of the coarse spectral filter corresponds to the spectral region of one of the DS-DBR grating sections of the reflector.

15. The discrete wavelength tunable laser of claim 14, wherein the SOA is a reflective semiconductor optical amplifier (RSOA).

16. The discrete wavelength tunable laser of claim 14, wherein the waveguide is a silicon photonics waveguide.

17. The discrete wavelength tunable laser of claim 14, wherein the coarse spectral filter is a transmission DS-DBR (TDS-DBR), the TDS-DBR having a plurality of transmission passbands, each of the passbands corresponding to the spectral region of a respective one of the DS-DBR grating sections of the reflector.

18. The reflector of claim 1, wherein the waveguide is a silicon photonics waveguide.

* * * * *